(12) United States Patent
Li et al.

(10) Patent No.: US 7,961,512 B2
(45) Date of Patent: Jun. 14, 2011

(54) ADAPTIVE ALGORITHM IN CACHE OPERATION WITH DYNAMIC DATA LATCH REQUIREMENTS

(75) Inventors: Yan Li, Milpitas, CA (US); Anne Pao-Ling Koh, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 134 days.

(21) Appl. No.: 12/051,462

(22) Filed: Mar. 19, 2008

(65) Prior Publication Data

US 2009/0237998 A1  Sep. 24, 2009

(51) Int. Cl.
*G11C 11/34* (2006.01)
(52) U.S. Cl. ......... 365/185.03; 365/185.12; 365/185.17; 365/185.22; 365/185.29; 365/185.33
(58) Field of Classification Search ............. 365/185.05, 365/185.11, 185.12, 185.17, 185.23, 185.25, 365/185.29, 185.33, 185.03, 185.22, 185.18, 365/185.21
See application file for complete search history.

(56) References Cited

U.S. PATENT DOCUMENTS

| | | | | |
|---|---|---|---|---|
| 6,717,857 | B2 * | 4/2004 | Byeon et al. | 365/185.21 |
| 7,242,620 | B2 * | 7/2007 | Nagashima | 365/185.21 |
| 7,336,543 | B2 * | 2/2008 | Chen et al. | 365/185.11 |
| 7,388,790 | B2 * | 6/2008 | Maejima et al. | 365/185.25 |
| 7,567,456 | B2 * | 7/2009 | Zanardi et al. | 365/185.05 |
| 7,619,922 | B2 * | 11/2009 | Li et al. | 365/185.12 |
| 2006/0221696 | A1 | 10/2006 | Li | |
| 2006/0221704 | A1 | 10/2006 | Li et al. | |
| 2006/0233010 | A1 | 10/2006 | Li | |
| 2006/0233021 | A1 | 10/2006 | Lin et al. | |
| 2006/0233023 | A1 | 10/2006 | Lin et al. | |
| 2006/0239080 | A1 | 10/2006 | Li | |
| 2007/0002626 | A1 | 1/2007 | Li | |
| 2007/0109867 | A1 | 5/2007 | Li | |

FOREIGN PATENT DOCUMENTS

| | | |
|---|---|---|
| EP | 1 134 746 A | 9/2001 |
| EP | 1 326 257 A | 7/2003 |
| WO | WO 2007/131062 | 11/2007 |

OTHER PUBLICATIONS

Notification of Transmittal of the International Search Report and the Written Opinion of the International Searching Authority, or the Declaration for International Application No. PCT/US2009/034573 mailed Apr. 29, 2009, 12 pages.

* cited by examiner

*Primary Examiner* — Trong Phan
(74) *Attorney, Agent, or Firm* — Davis Wright Tremaine LLP

(57) ABSTRACT

A non-volatile memory can perform a first operation (such as a write, for example) on a designated group of one or more addressed pages using a first set of data stored in the corresponding set of data latches and also receive a request for a second operation (such as a read, for example) that also uses some of these corresponding data latches with a second set of data. During the first operation, when at least one latch of each set of the corresponding become available for the second operation, the memory whether there are a sufficient number of the corresponding set of data latches to perform the second operation during the first operation; if not, the second operation is delayed. The memory subsequently can perform the second operation during the first operation when a sufficient number of latches become available; and if, in response to determining whether there are a sufficient number of the corresponding set of data latches to perform the second operation it is determined that there are a sufficient number, performing the second operation during the first operation.

25 Claims, 5 Drawing Sheets

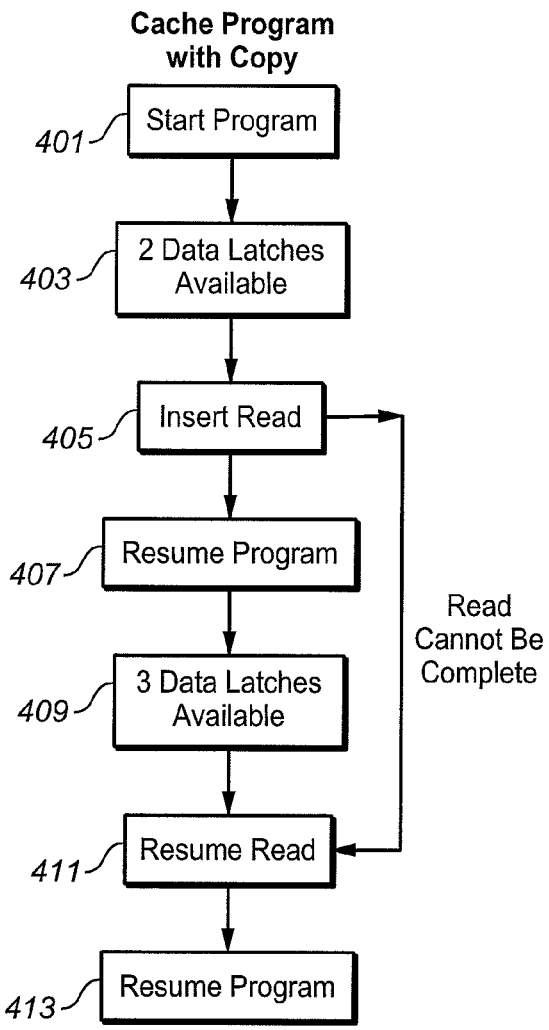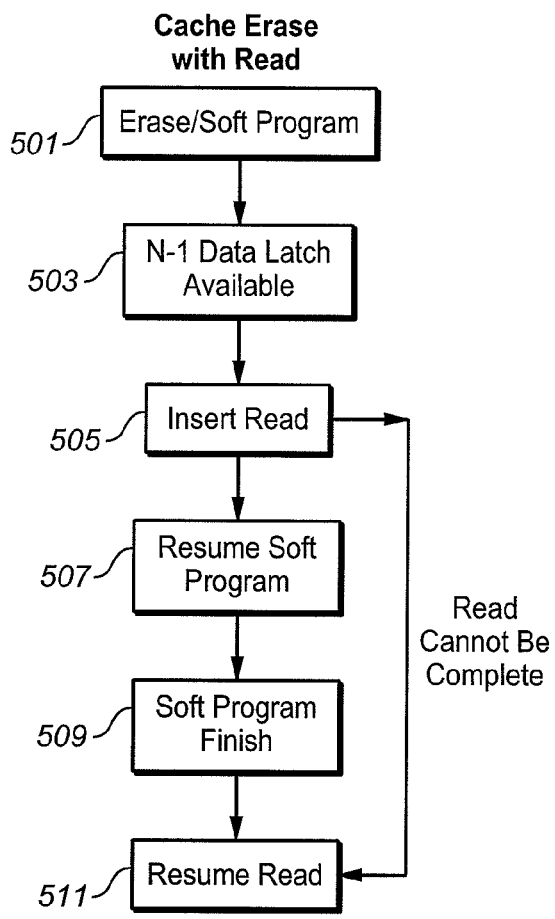
FIG. 4
FIG. 5

US 7,961,512 B2

ADAPTIVE ALGORITHM IN CACHE OPERATION WITH DYNAMIC DATA LATCH REQUIREMENTS

FIELD OF THE INVENTION

This invention relates generally to non-volatile semiconductor memory such as electrically erasable programmable read-only memory (EEPROM) and flash EEPROM, and specifically to cache operations based on shared latch structures allowing overlapping memory operations.

BACKGROUND OF THE INVENTION

In the design of non-volatile memories, such as flash memory, there is a continuing process of improving these memories by increasing their storage density, increasing their performance, and reduce power consumption. Improvements in one of these requirements will often negatively affect one of the others. For example, to improve storage density, flash memory with multiple levels per cell can be used to replace the binary chips; however, the speed of operations can be slower in multi-state memories, such as in the case of writing data where the tolerances between states become stricter. Consequently, the performance level of memories having multi-level cells has much scope for improvement.

These and related problems, along with additional background information, is given in the Background section of U.S. patent application publication numbers US-2006-0221704-A1 and US-2007-0109867-A1. The following U.S. patent application publication numbers also provide additional background information: US 2006-0233023-A1; US 2006-0233021-A1; US 2006-0221696-A1; US 2006-0233010-A1; US 2006-0239080-A1; and US 2007-0002626-A1. As noted below, all of these are fully incorporated herein by reference.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

A non-volatile memory and corresponding method of operation are presented, where the memory has addressable pages of memory cells and each memory cell of an addressed page is provided with a set of corresponding data latches that can latch a predetermined number of bits. The memory can perform a first operation (such as a write, for example) on a designated group of one or more addressed pages using a first set of data stored in the corresponding set of data latches and also receive a request for a second operation (such as a read, for example) that also uses some of these corresponding data latches with a second set of data. During the first operation, when at least one latch of each set of the corresponding becomes available for the second operation, it is determined whether there are a sufficient number of the corresponding set of data latches to perform the second operation during the first operation; if not, the second operation is delayed. In additional aspects, the memory subsequently performs the second operation during the first operation when a sufficient number of latches become available; and if, in response to determining whether there are a sufficient number of the corresponding set of data latches to perform the second operation it is determined that there are a sufficient number, performing the second operation during the first operation.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 4 illustrates inserting a read inside a cache program operation when there are insufficient latches available.

FIG. 5 illustrates inserting a read inside a cache erase operation when there are insufficient latches available.

DETAILED DESCRIPTION OF THE PREFERRED EMBODIMENTS

Figure 1:
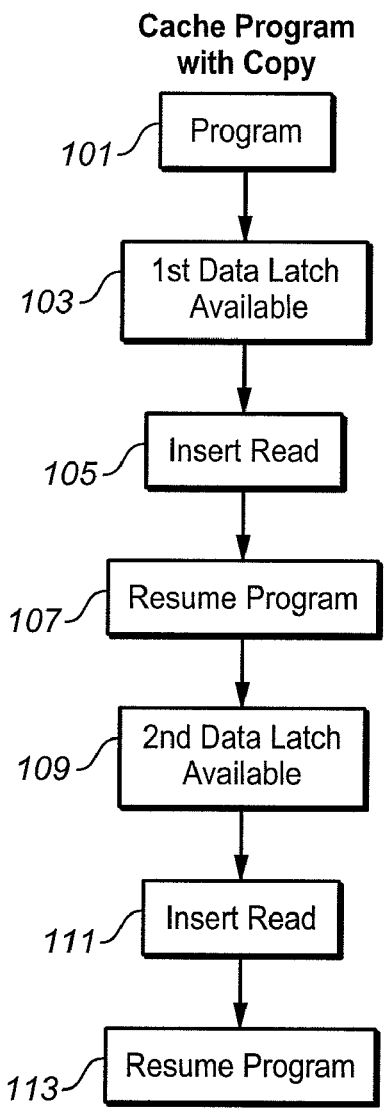
FIG. 1 illustrates inserting a read inside a cache program operation.

As non-volatile memories, such as NAND flash memory, with multi levels per cell are used to replace binary chips, there is a generally agreed need for performance to improve. One set of performance enhancements is based on utilizing complicated cache algorithm to do parallel operations at the same time. Examples of some such enhancements are given U.S. patent application publication numbers US-2006-0221704-A1 and US-2007-0109867-A1. Reference is also made to the following U.S. patent application publication numbers, which provide additional detail on many aspects: US 2006-0233023-A1; US 2006-0233021-A1; US 2006-0221696-A1; US 2006-0233010-A1; US 2006-0239080-A1; and US 2007-0002626-A1. All of these references, along with references cited therein, are fully incorporated herein by reference, as noted above. Some of the techniques are described below to provide context for the subsequent development, but reference is again made to these prior applications for further detail. In this regard, the following can to some degree be considered a further development of what is described there.

In the aforementioned patent documents, particular reference is made to the sections describing the use of data latches and how these can be used to insert one operation, such as a read, within a second, longer operation, such as a program. Although much of that previous discussion was given primarily for 2-bit per cell embodiments, much the discussion here is related to aspects which are most pertinent for cases of 3 or more bits per cell.

Look Ahead read is an algorithm that uses a corrective reading that depends on the data of the next word. Read with the LA ("Look Ahead") correction basically examines the memory states programmed into the cells on an adjacent wordline and corrects any perturbation effect they have on the memory cells being read on the current wordline. If the pages have been programming according to a preferred programming scheme described in the cited references, then the adjacent wordline will be from the wordline immediately above the current one. The LA correction scheme would require the data on the adjacent wordline to be read prior to the current page.

The number of data latches required to do a LA read will depend on the correction that is required. In some cases this will be a 1 bit correction, others will use a 2 bit or 3 bit correction. The correction needed for each page will depend on the program sequence that the page and the adjacent pages went through. In some cases, one page will need only 1 bit correction, while another page will possibly use 2 bit correction. These different correction levels will use different numbers of data latches to handle the LA read. When doing mixed cache operations, such as inserting a read in cache program for a copy function, or inserting a read in a cache erase operation, the variations of data latch requirements for the read is preferably accounted for in the cache algorithms. The data latch requirement is also unknown before the user (e.g., a controller or host) issues the address. To better handle these complications a new cache algorithm, called adaptive algorithm in the following, is introduced.

In order to provide context, these techniques will described below in an embodiment using a "look ahead" read ("LA") and a "lower middle" ("LM") coding for the data multi-states. Such an arrangement is presented in more detail in the US patent publications cited above, such as in US 2006-0239080-A1, beginning at paragraph [0295], in the section entitled "Cache Read Algorithm for LM code with LA Correction". Briefly, as described there, a scheme for caching read data is implemented so that even for read operation whose correction depend on data from a neighboring physical page or wordline, the data latches and I/O bus are efficiently used to toggle out a previously read page while a current page is being sensed from the memory core. One preferred read operation is a "look ahead" ("LA") read and a preferred coding for the memory states is the "lower middle" ("LM") code. When the read for a current page on a current wordline must be preceded by a prerequisite read of data on an adjacent wordline, the prerequisite read along with any I/O access is preemptively done in the cycle for reading a previous page so that the current read can be performed while the previously read page is busy with the I/O access. The LA reading scheme has been disclosed in U.S. patent application Ser. No. 11/099,049 filed on Apr. 5, 2005, entitled, "Read Operations for Non-Volatile Storage that Includes Compensation for Coupling," which entire disclosure is herein incorporated by reference. Read with the LA ("Look Ahead") correction basically examines the memory states programmed into the cells on an adjacent wordline and corrects any perturbation effect they have on the memory cells being read on the current wordline. If the pages have been programming according to the preferred programming scheme described above, then the adjacent wordline will be from the wordline immediately above the current one. The LA correction scheme would require the data on the adjacent wordline to be read prior to the current page.

Returning to the further developments being presented here in this exemplary embodiment, when the data latch requirement is associated to the LM flag, then the user command may be executed and internally determined that there are not enough data latches to finish the execution of the command. The adaptive algorithm remembers the user command, waits for the availability of the sufficient data latches, and then executes the command as the data latches become available during the course of the operation.

Figure 2:
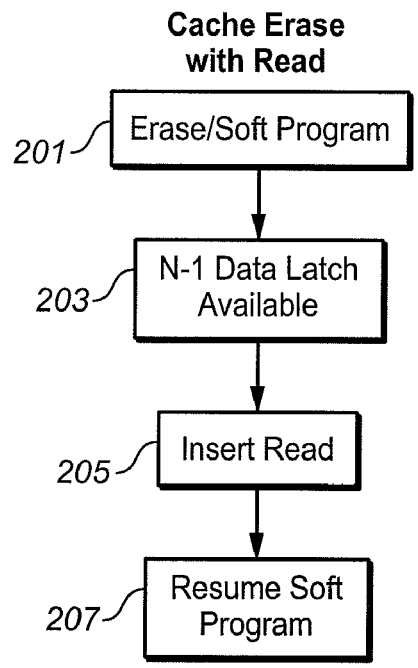
FIG. 2 illustrates inserting a read inside a cache erase operation.

FIGS. 1 and 2 respectively give example of inserting a read into a cache program and a cache erase operation. In the cache program with copy operation of FIG. 1, the process begins with the program operation beginning at 101. This continues until a first latch in is freed up in the corresponding stacks of data latches at 103, a process described in more detail US-2006-0221704-A1 and US-2007-0109867-A1. At this point a read can be inserted into the program operation at 105, after which the write operation continues at 107. In the course of programming, a second latch again becomes available at 109. This second latch may be the same latch as at 103, or a different latch in the same stack. Again, as this process is generally implemented at the page level, the typical embodiment would then require a corresponding latch for each cell in the page. In any case, a read is then again inserted at 111, after which the program operation continues on at 113.

FIG. 2 is the corresponding arrangement for a cache erase with read. An erase process, here with including a soft programming operation, is started at 201. At 203, data latches are avail for an interposed operation. Since a soft program operation can be considered a sort of binary programming operation, for N-state memory cells, this will typically result in the there being (N−1) available latches. A read operation can then be interposed at 205, after which the soft programming phase can continue at 207.

When the insert read operation (105 or 111 in FIG. 1, 205 in FIG. 2) is a look ahead read operation, the data latch requirements will depend on the amount of correction used. In one algorithm, in order to perform a look ahead read on wordline n (WLn), 1 bit correction will use 2 data latches, with one data latch is for WLn+1 data and one for 1 page of WLn data. Similarly, with 2 bit correction, 3 data latches are used (two for WLn+1 data and one for 1 page of WLn data), and with 3 bit correction, 4 data latches are used (three for WLn+1 data and one for 1 page of WLn data). An alternate embodiment that will require only two latches for all LA corrections is described in U.S. patent application Ser. Nos. 11/618,569 and 11/618,578.

Next, the inclusion of the lower middle ("LM") page order and the corresponding latch requirements are consider when combined with the LA read, an arrangement that is developed in more detail in a U.S. patent application entitled "Different Combinations of Wordline Order and Look-Ahead read to improve Non-Volatile Memory performance" of Yan Li, filed Mar. 19, 2008. Taking the 3 bits per cell case, the pages may be arranged so that the lower and middle are consecutive and programmed together, but where the upper page will be jumped in a way that upper page program will tend to eliminate the middle page to middle page WL-WL coupling effects. The upper page is programmed after the next wordline's middle page program.

Figure 3:
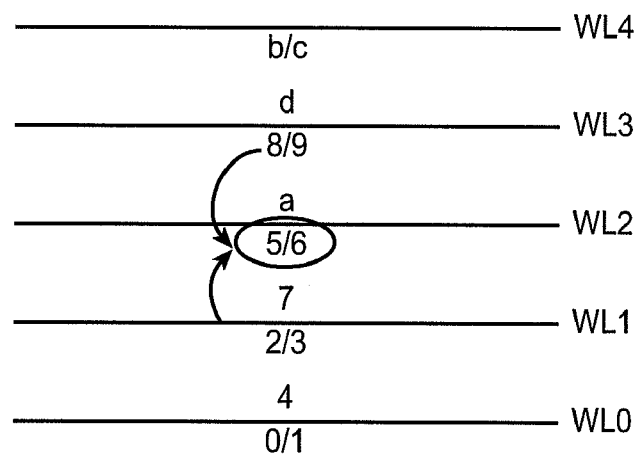
FIG. 3 shows a particular programming order for pages and some corresponding look ahead reads.

The process is shown in FIG. 3, where pages 0 and 1 are programmed together (0/1) on the first wordline (WL0) as the lower and middle pages, followed by pages 2 and 3 being programmed together (2/3) as the lower and middle pages on the next wordline (WL1). Next the process drops back a page (to WL0) and programs the upper page (4) and then jumps ahead two wordlines (to WL2) and programs the lower and middle page (5/6). This drop back for the upper page and jump ahead for the two lower pages continues on WL1, WL2, WL3, WL4 for the rest of the data set of pages 7-d (7, 8/9, a, b/c, d), where a, b, c and d are pages 10, 11, 12 and 13 in hexadecimal notation. In this way, much of the WL-WL and BL-BL coupling effects will be effectively corrected by the upper page program. During upper page program, the lower and middle page will be read in with LA read to correctively read in data from the memory cells. In this page arrangement, an upper page read will need only 1 bit correction, since the upper page is only coupled (up arrow FIG. 3) to the next WL upper page program. A middle page read, on the other hand, will use 2 bits for LA read correction, since lower and middle page can couple (down arrow FIG. 3) the previous wordlines middle page voltage thresholds.

Adaptive Algorithm to Deal with Dynamic Data Latch Requirements

As can be seen from the examples just given, the data latch requirements for such cache operations is variable depending on the circumstances. The adaptive algorithm given here takes this into account.

Going back to the example of a cache program with an inserted read for copy case, this is shown in FIG. 4, where the program operation begins at 401. As the operation continues, at some point a pair of latches for each cell in the page is freed up at 403. At this point a read can be inserted as shown at 405. This may either be a read that the state machine was already holding, waiting for latches to open up, or a read request that comes in after the latches open, in which case the programming would have continued until the read came in. In either case, once the read is inserted, it may be determined that 2 latches are not enough to complete this read. A read command may be entered when 2 data latch is available, but may only be executed by assuming that the upper page read uses only a 1 bit LA read; however, if the page does not have its upper page programmed, it will need 2 bits for the LA read. Typically, the latches will have been filled with program data, but once it is determined that further latches are needed, the read data would be treated as invalid. In this situation, the read command the user (i.e., the controller) issued cannot be completed until more data latches are available. In this example, the read cannot be executed until 3 data latches are available. Once the memory determines that there are insufficient latches and the read cannot be completed, the command held until the needed latches are available, as shown by the arrow.

Meanwhile, the write process continues at 407 until, at 409, another latch is opened up. The read is then inserted again and completed at 411, after which the write continues at 413. It should be noted that this is just one generic example of the process which could have a number of variations; for example, this case assumes that the write is not completed prior to step 413.

A similar situation can happen in a cache erase inserting a read, as shown in FIG. 5. The erase with soft program begins at 501. For N=3 bits of data per cell, there are 2 data latch available in soft program (at 503), which is able to handle a 1 bit LA read; but if 2 bits LA read is needed, then the read has to be executed after the whole soft program completed. Consequently, the read is inserted at 505 and, if there are not the needed number of latches to successfully complete the read, it is but on hold, the soft program is resumed at 507 and finished at 509, after which the read is re-inserted at 511.

Figure 6:
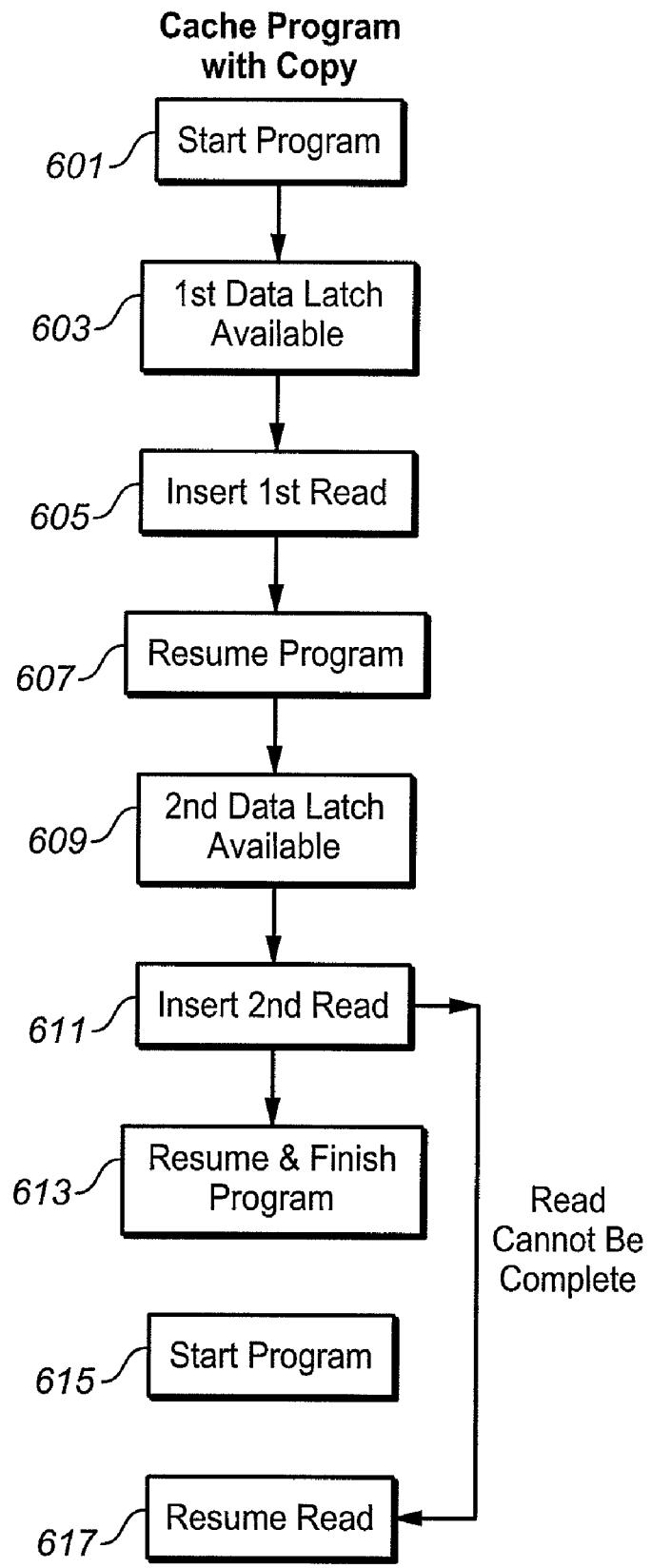
FIG. 6 is another example of inserting a read inside a cache program operation when there are insufficient latches available.

FIG. 6 illustrates another situation, where the adaptive cache operation could be complicated to manage. FIG. 6 shows an example where a first read is executed in 601-607 without needing more latches than the available latches, much as in patent publications referenced above. This read-in page will be checked for ECC and then ready to be programmed into another location. During the upper page program (part of 607), a second read can be inserted after 609 at 611. If the second read can not be executed due to the unavailability of sufficient data latches, the second read can not be executed immediately and will wait until the upper page finish its program (613).

At the end of upper page program, the first read data (which has not yet been programmed) is still in the data latches will be transferred to the right location. The second read command can be executed after the upper page program finished. Once a program has to be started again (615) the incomplete read can be executed again (617), much as described with respect to FIG. 4.

General Management for Adaptive Algorithm

Figure 7:
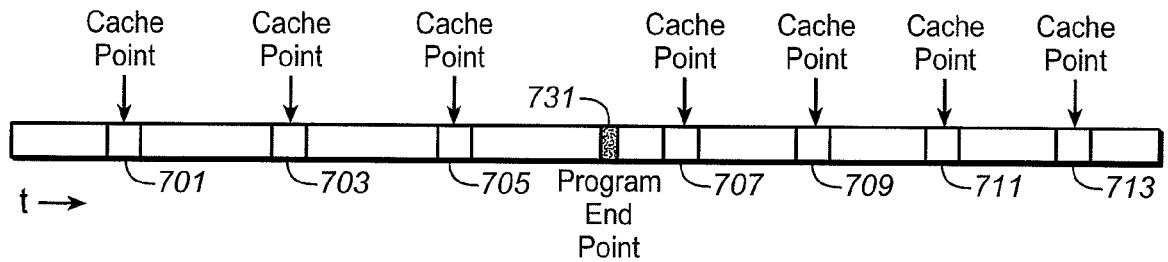
FIG. 7 shows schematically how various cache points occur.
Figure 8:
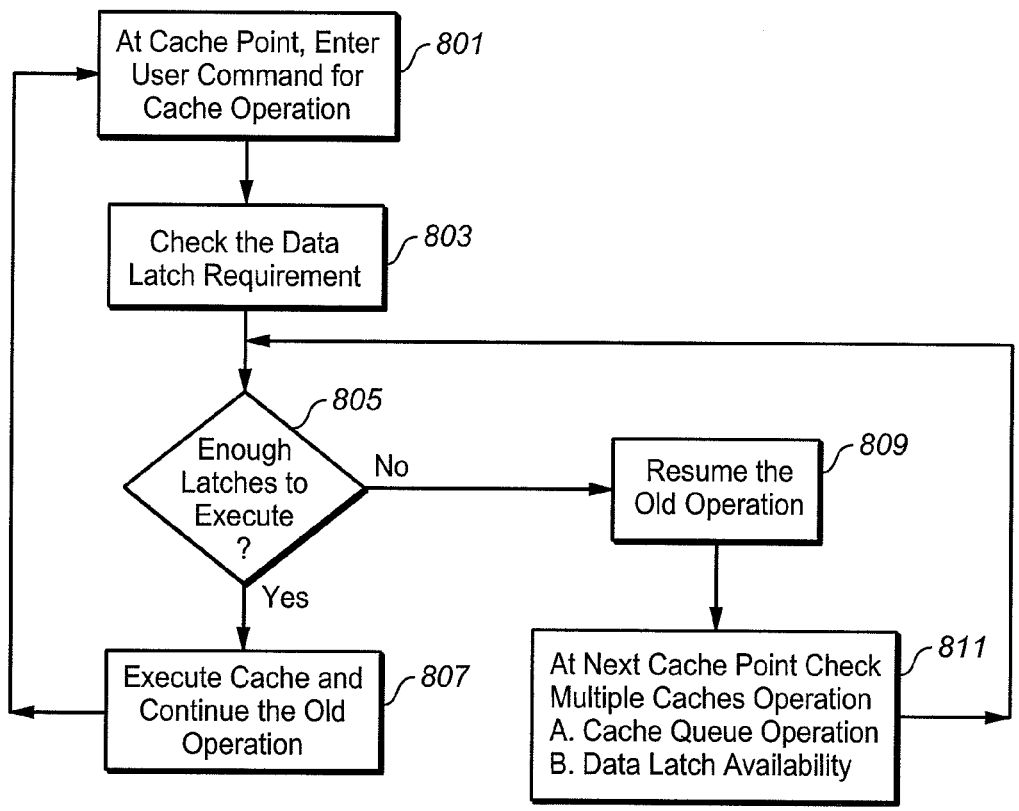
FIG. 8 is a flow chart for one basic embodiment of the adaptive algorithm.

A general adaptive cache operation algorithm can be illustrated by FIGS. 7 and 8. In the cache operation, there are multiple cache points which indicate that another operation can be inserted. FIG. 7 shows this conceptually, where time is taken as running to the right (t→) and diagram picks up at some more or less arbitrary point in operation of an ongoing write command. The various available cache points are as indicated at 701, 703, . . . , 713, where the write operation that was in process when FIG. 7 begins ends at 731, after which the next write takes up.

FIG. 8 is a flowchart of one exemplary embodiment. A command for the operation will be issued and at a cache point (indicated by a Ready/Busy signal, for example) the command is entered. After the user command issued, the state machine will check if there are enough data latches to execute this command at 803. If there are enough data latches (yes out of 805), then the user command can be executed immediately at 807 and then return to 801.

If there are not enough data latches available (No out of 805) or the previous queued cache is still in the pipeline, then the old operation will be resumed (809) while the cache pointer is tracked to get the next available cache point. At the next cache point, the execution of the previous user command will be evaluated again (811) based on 2 factors: A. the cache queue in the pipeline; B. the data latch availability. Once the command is at the head of the queue and there are sufficient latches, the command can then be executed at 807. In all the cache operations, the address and commands has to be saved in FIFO pipelines.

Figure 9:
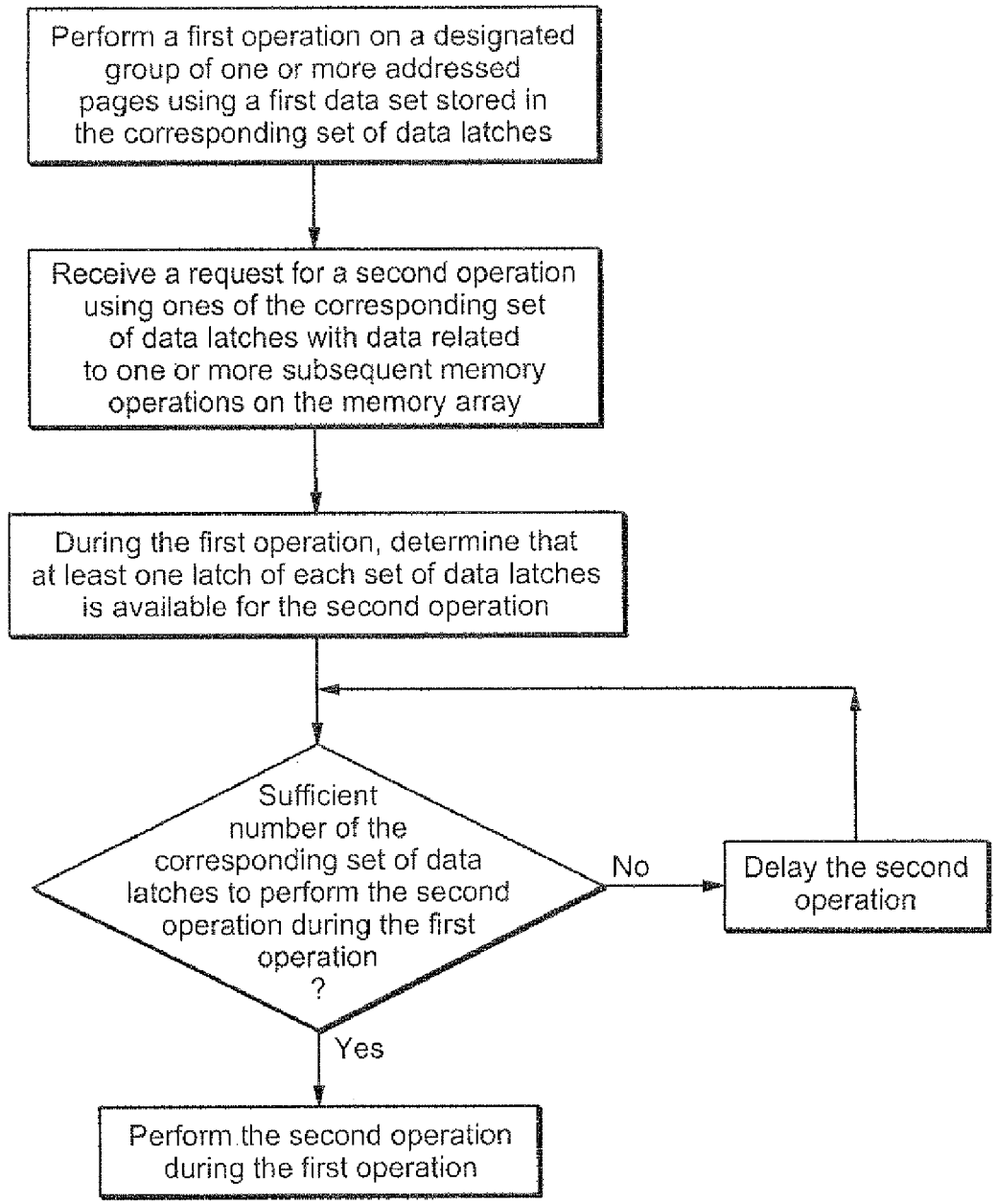
FIG. 9 is a flow chart for a general embodiment.

FIG. 9 is a flow chart for a general embodiment of operating a non-volatile memory having addressable pages of memory cells. Each memory cell of an addressed page is provided a set of corresponding data latches having capacity for latching a predetermined number of bits and a first operation is performed on a designated group of one or more addressed pages using a first data set stored in the corresponding set of data latches. A request is received for a second operation using ones of the corresponding set of data latches with data related to one or more subsequent memory operations on the memory array. During the first operation, it is determined that at least one latch of each set of data latches is available for the second operation. It is subsequently determined whether there are a sufficient number of the corresponding set of data latches to perform the second operation during the first operation. In response to determining that there are a sufficient number of the corresponding set of data latches to perform the second operation, the second operation can be performed during the first operation. In response to determining that there are not a sufficient number of the corresponding set of data latches to perform the second operation, the second operation is delayed; and the second operation can be subsequently performed during the first operation when a sufficient number of latches become available.

Although the various aspects of the present invention have been described with respect to certain embodiments, it is understood that the invention is entitled to protection within the full scope of the appended claims.

What is claimed is:

1. A method of operating a non-volatile memory including a memory array having addressable pages of memory cells and a plurality of data latches, where each memory cell of an addressed page has a set of corresponding data latches having capacity for latching a predetermined number of bits, the method comprising:
performing a first operation on a designated group of one or more addressed pages using a first data set stored in the corresponding set of data latches;
receiving a request for a second operation using ones of the corresponding set of data latches with data related to one or more subsequent memory operations on the memory array;
during the first operation, determining that at least one latch of each set of data latches is available for the second operation;
subsequently determining whether or not there are a sufficient number of the corresponding set of data latches to perform the second operation during the first operation; and
in response to determining that there are not a sufficient number of the corresponding set of data latches to perform the second operation during the first operation, delaying the second operation.

2. The method of claim 1, further comprising:
subsequently performing the second operation during the first operation when a sufficient number of latches become available.

3. The method of claim 1, further comprising:
in response to determining that there are a sufficient number of the corresponding set of data latches to perform the second operation during the first operation, performing the second operation during the first operation.

4. The method of claim 1, wherein the first operation is a soft programming phase of an erase operation.

5. The method of claim 1, wherein the first operation is a programming operation.

6. The method of claim 5, wherein the second operation is a read operation.

7. The method of claim 6, wherein the read operation is a look ahead read operation for use in the program operation.

8. The method of claim 1, wherein the first operation is a write operation having alternating program and verify phases and the first set of data is the data to, be written into the first group of memory cells.

9. The method of claim 1, wherein said memory cells are multi-level memory cells storing N bits of data, where N is greater than one, and wherein each of said sets of data latches includes N data latches and said first data set is N bit data.

10. The method of claim 1, wherein the request for the second operation is received during said performing of the first operation.

11. The method of claim 1, wherein the request for the second operation is prior to beginning said performing of the first operation.

12. The method of claim 1, wherein said determining that at least one latch of each set of data latches is available for the second operation is based on a Ready/Busy signal.

13. A non-volatile memory, comprising:
a memory array including addressable pages of memory cells; and
a plurality of data latches, where each memory cell of an addressed page has a set of corresponding data latches having capacity for latching a predetermined number of bits,
wherein during the first operation on a designated group of one or more addressed pages using a first data set stored in the set of corresponding data latches, the memory can determine that at least one latch of each set of corresponding data latches is available for a requested second operation using ones of the set of corresponding data latches with data related to one or more subsequent memory operations on the memory array, subsequently determine whether or not there are a sufficient number of the set of corresponding data latches to perform the second operation during the first operation, and, in response to determining that there are not a sufficient number of the set of corresponding data latches to perform the second operation, delay the second operation.

14. The non-volatile memory of claim 13, where the memory subsequently performs the second operation during the first operation when a sufficient number of latches become available.

15. The non-volatile memory of claim 13, wherein, in response to determining that there are said sufficient number of the set of corresponding data latches to perform the second operation, the memory performs the second operation during the first operation.

16. The non-volatile memory of claim 13, wherein the first operation is a soft programming phase of an erase operation.

17. The non-volatile memory of claim 13, wherein the first operation is a programming operation.

18. The non-volatile memory of claim 17, wherein the second operation is a read operation.

19. The non-volatile memory of claim 18, wherein the read operation is a look ahead read operation for use in the program operation.

20. The non-volatile memory of claim 13, wherein the first operation is a write operation having alternating program and verify phases and the first set of data is the data to be written into the first group of memory cells.

21. The non-volatile memory of claim 13, wherein said memory cells are multi-level memory cells storing N bits of data, where N is greater than one, and wherein each of said sets of data latches includes N data latches and said first data set is N bit data.

22. The non-volatile memory of claim 13, wherein the request for the second operation is received during the performance of the first operation.

23. The non-volatile memory of claim 13, wherein the request for the second operation is prior to beginning the performance of the first operation.

24. The non-volatile memory of claim 13, wherein the determination that at least one latch of each set of data latches is available for the second operation is based on a Ready/Busy signal.

25. The non-volatile memory of claim 13, further comprising:
a state machine, where the state machine performs said determining that at least one latch of each set of data latches is available for a requested second operation, said determination whether there are said sufficient number of the set of corresponding data latches to perform the second operation during the first operation, and said delaying of the second operation.

* * * * *